United States Patent
Hynecek

(10) Patent No.: US 7,940,319 B2
(45) Date of Patent: May 10, 2011

(54) IMAGE SENSOR PIXEL WITHOUT ADDRESSING TRANSISTOR AND METHOD OF ADDRESSING SAME

(75) Inventor: Jaroslav Hynecek, Allen, TX (US)

(73) Assignee: Crosstek Capital, LLC, Wilmington, DE (US)

(*) Notice: Subject to any disclaimer, the term of this patent is extended or adjusted under 35 U.S.C. 154(b) by 571 days.

(21) Appl. No.: 12/003,166

(22) Filed: Dec. 20, 2007

(65) Prior Publication Data

US 2008/0151091 A1 Jun. 26, 2008

(30) Foreign Application Priority Data

Dec. 22, 2006 (KR) .................. 10-2006-0132635

(51) Int. Cl.
*H04N 3/14* (2006.01)
(52) U.S. Cl. ...................................... 348/308; 348/302
(58) Field of Classification Search .................. 348/294, 348/296, 302, 308
See application file for complete search history.

(56) References Cited

U.S. PATENT DOCUMENTS

| 5,881,184 | A | 3/1999 | Guidash | |
|---|---|---|---|---|
| 2005/0128326 | A1* | 6/2005 | Korthout et al. | 348/308 |
| 2005/0128327 | A1* | 6/2005 | Bencuya et al. | 348/308 |
| 2006/0001755 | A1* | 1/2006 | Sato et al. | 348/308 |
| 2006/0203114 | A1* | 9/2006 | Xu | 348/308 |

FOREIGN PATENT DOCUMENTS

| JP | 10-336527 | 12/1998 |
|---|---|---|
| JP | 2003-224777 | 8/2003 |

* cited by examiner

*Primary Examiner* — Timothy J Henn
(74) *Attorney, Agent, or Firm* — McAndrews, Held & Malloy, Ltd.

(57) ABSTRACT

The invention describes in detail a solid-state CMOS image sensor, specifically the CMOS image sensor pixel that has only two row lines per pixel, pinned photodiode for sensing light, and one or two column lines. The pixel does not have an address transistor and the sensing and reset transistors are both MOS p-channel type. This architecture results in a low noise operation with a very small output transistor random noise. In addition this new pixel architecture allows for the standard CDS signal processing operation, which reduces the pixel to pixel non-uniformities and minimizes kTC reset noise. The pixel has high sensitivity, high conversion gain, high response uniformity, and low noise, which is enabled by the efficient 3T pixel layout.

18 Claims, 5 Drawing Sheets

IMAGE SENSOR PIXEL WITHOUT ADDRESSING TRANSISTOR AND METHOD OF ADDRESSING SAME

CROSS-REFERENCE TO RELATED APPLICATIONS

The present invention claims priority to Korean patent application number 10-2006-0132635, filed on Dec. 22, 2006, which is incorporated by reference in its entirety.

BACKGROUND OF THE INVENTION

The present invention relates to a solid-state image sensor, more particularly to a CMOS image sensor that has high resolution, high performance, and very small pixel sizes. In particular this invention relates to a pixel that has only three transistors (3T), two row control lines, and two column control lines. Further more the pixels are still capable of standard low noise correlated double sampling operation, as is typically used with 4T pixel architectures, using low noise p-channel MOS transistors for sensing and resetting without address transistors.

Typical image sensors sense light by converting impinging photons into electrons that are integrated (collected) in sensor pixels. After completion of integration cycle a voltage corresponding to collected charge is supplied to output terminals of the image sensors.

In typical CMOS image sensors the charge is converted to the corresponding voltage directly in the image pixels themselves and the analog pixel voltage is transferred to the output terminals through various pixel addressing and scanning schemes. The analog signal can also be converted on-chip to a digital equivalent before reaching the chip output. Generally, the sensor pixels have incorporated in them a buffer amplifier, typically a source follower, which drives the sense lines connected to the respective sense pixels by suitable addressing transistors.

After charge to voltage conversion is completed and the resulting signal is transferred out from the sense pixels, the sense pixels are reset in order to be ready for accumulation of new charge. In pixels that are using Floating Diffusion (FD) as the charge detection node, a reset transistor is provided for the reset operation. During reset the transistor is turned on, thereby momentarily conductively connecting the FD node to a voltage reference.

Through this step, collected charge is removed from the pixels; however, kTC-reset noise is generated as is well known in the art. The kTC noise has to be removed from the signal by the Correlated Double Sampling (CDS) signal processing technique in order to achieve desired low noise performance. The typical CMOS sensors that utilize the CDS concept need to have four transistors (4T) in the pixel. An example of the 4T pixel circuit can be found in the U.S. Pat. No. 5,881,184 to Guidash.

Since such high performance pixels have 4 transistors incorporated in them the pixels require several signal control lines for their operation. Typically such pixels have a reset line, a charge transfer line, and an address line in the row direction and a supply voltage (Vdd) line and an output voltage (Vout) line in the column direction. It is possible to share some of these lines and corresponding transistors between the neighboring pixels, but this causes other complications related to intra-pixel interconnecting lines. The larger number of transistors and increased number of row and column lines consumes a valuable pixel area and thus significantly reduces the pixel active area that could otherwise be used for charge storage and light sensing.

FIG. 1 is a schematic circuit diagram of a conventional 4T CMOS image sensor pixel with a pinned photodiode.

The pinned photodiode 101 is coupled through a charge transfer transistor 102 to a FD node 103. A sensing Source Follower (SF) transistor 104 has its gate connected to the FD node 103, drain connected to a Vdd node 105 and source connected through an addressing transistor 106 to an output column bus 107. The Vdd node 105 is connected to a Vdd column bus 108. The FD node 103 is reset, i.e., connected to the Vdd node 105 by a reset transistor 109. The gate of the reset transistor 109 is controlled by a signal applied on a first row bus line 110, the gate of the address transistor 106 is controlled by a signal applied on a second row bus line 111, and the gate of the charge transfer transistor 102 is controlled by a signal applied on a third row bus line 112.

As photons 113 impinge on the photodiode 101, electron charge is generated there. After completion of charge integration the FD node 103 is reset and all charge from the photodiode 101 is transferred on the FD node 103. This changes the FD voltage from the original reset level to a new signal level. Both levels; the reset level and the signal level on the FD node are then sensed by the sensing SF transistor 104 and both levels are transferred onto the output column bus 107. They are further transferred into column signal processing circuits for subtraction and additional processing. The subtraction of the reset level from the signal level is called Correlated Double Sampling, CDS, which removes the kTC noise and the transistor threshold non-uniformities from the signal to be output. This is one of the main advantages of the 4T pixel circuit.

However, in the 4T pixel circuit, the four transistors occupy a large amount of the valuable active pixel area and three row control lines are required for the operation. This is a disadvantage of this circuit that is some times compensated by sharing the circuits with several photodiodes. However, the circuit sharing has also its disadvantages.

Due to the circuit sharing, the FD node capacitance is increased, which reduces the pixel sensitivity. The interconnection lines need to be additionally provided so they occupy the valuable pixel area. Other disadvantages of this concept are slightly asymmetrical layout and electrical function that result in some asymmetrical optical as well as electrical cross talk problems. It is therefore desirable to maintain the charge transfer concept using the pinned photodiode but reduce the number of transistors in the pixel and to maintain the pixel symmetry.

SUMMARY OF THE INVENTION

Embodiments of the present invention are directed to providing a CMOS image sensor device with very small pixel sizes, pixels which have only two row lines, two column lines per pixel, and no addressing transistors.

Embodiments of the present invention are also directed to providing a CMOS image sensor pixel that uses a pinned photodiode for the light sensing and has only three transistors in the pixel, which allows building a small pixel with large charge conversion gain without any circuit sharing and still provides for the full CDS operation to achieve a complete charge transfer from the pinned photodiode with the typical almost complete kTC noise elimination.

In accordance with an aspect of the present invention, there is provided a CMOS image sensor pixel which includes a pinned photodiode, a transferring device for transferring charge integrated in the pinned photodiode in response to a transfer control signal, a floating diffusion configured to receive charge through transferring device, a first p-type MOS transistor for resetting the floating diffusion in response to a reset control signal, and a second p-type MOS transistor for generating pixel output signals corresponding to charge Qn the floating diffusing.

In accordance with another aspect of the present invention, there is provided a CMOS image sensor pixel which includes a plurality of pinned photodiodes, a plurality of charge transferring devices for transferring charge integrated in the pinned photodiodes in response to transfer control signals, a common floating diffusion configured to receive charge through charge transferring devices, a first p-type MOS transistor for resetting the common floating diffusion in response to a reset control signal, and a second p-type MOS transistor for generating pixel output signal corresponding to charge of the common floating diffusion.

In accordance with a third aspect of the present invention, there is provided a CMOS image sensor pixel array which includes pixels arrayed along columns and rows, wherein each pixel has a first and a second p-type MOS transistors for receiving a reference bias through a source and a body thereof respectively, first column bus lines configured to the columns respectively and provided with pixel output signals, second column bus lines configured to the columns respectively and each providing the reference bias, first row bus lines configured in the rows respectively and each providing a reset control signal, and second row bus lines configured to the rows respectively and each providing a transfer control signal.

In accordance with a fourth aspect of the present invention, there is provided a CMOS image sensor pixel array which includes pixels arrayed along columns and rows, wherein each pixel has a first and a second p-type MOS transistors for receiving a reference bias through a source and a body thereof respectively, first column bus lines configured to the columns respectively and each provided with pixel output signals, first row bus lines configured to the rows respectively and each providing the reference bias, second row bus lines configured in the rows respectively and each providing a reset control signal, and third row bus lines plurally configured to the rows respectively and each providing a transfer control signal.

DETAIL DESCRIPTION OF PREFERRED EMBODIMENTS

In accordance with the present invention, a different approach to building the small pixel size CMOS image sensors is described, which addresses difficulties in the conventional approach and provides a simpler and more practical solution. This invention provides smaller pixels with improved charge storage capacity, increased optical aperture response, and increased sensitivity. By eliminating an address transistor from the pixel and by replacing the charge sensing transistor with a low noise p-channel MOS transistor it is possible to operate such pixels with only two row address lines and two column lines without any circuit sharing. The output column line is thus common to every pixel sensing transistor source follower diffusion in one column. Furthermore; by eliminating the addressing transistor from the pixel it is possible to achieve a significant increase in the pixel charge conversion gain since no circuit sharing is necessary to achieve the small pixel size and as a consequence the FD capacitance can be very small.

Another feature which distinguishes this invention from the prior art and which results in a practical design, is a reset transistor, which is also p-channel MOS transistor. This allows the hard reset of the pixel FD node without any voltage loss due to the transistor threshold. Finally, the last important and distinguishing feature of the present invention from the prior art is that despite having only three transistors in the pixel it is still possible to use the full CDS operation to sense charge with the complete charge transfer from a pinned photodiode and with typical almost complete elimination of kTC reset noise.

Hereinafter, the invention will be described in detail in the following description of preferred embodiments with reference to the accompanying drawings.

Figure 1:
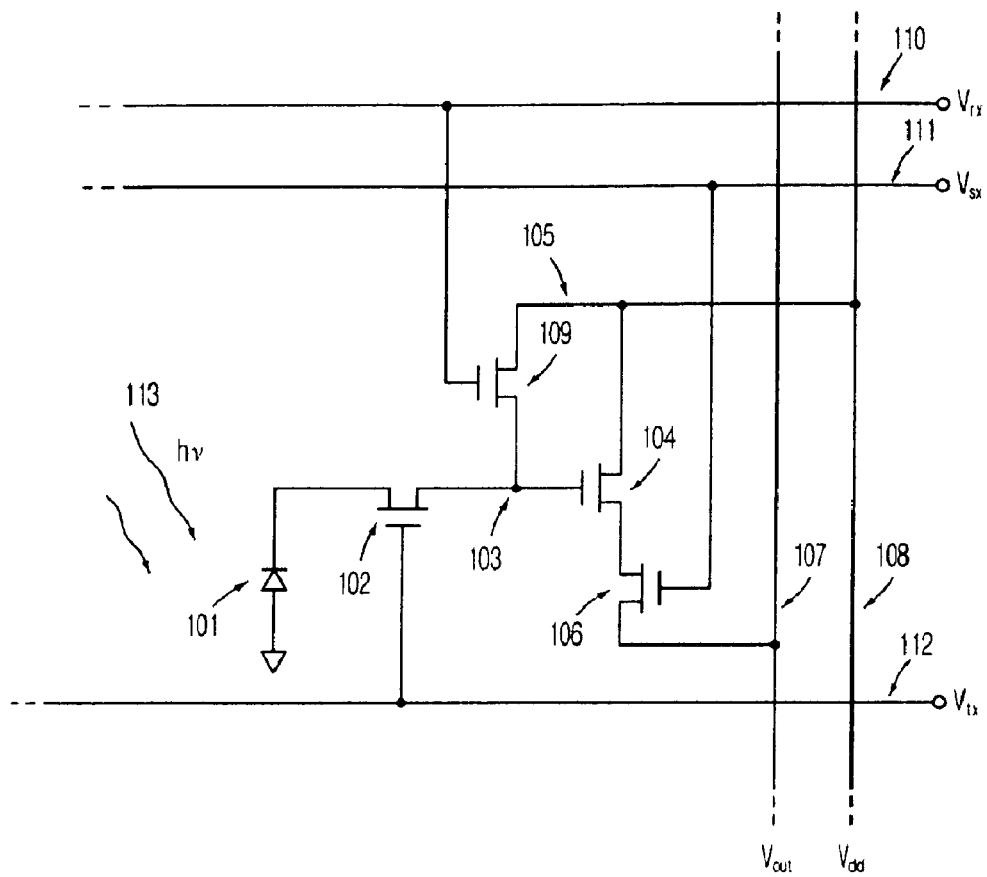
FIG. 1 is a schematic circuit diagram of a conventional 4T CMOS image sensor pixel with a pinned photodiode for sensing light.
Figure 2:
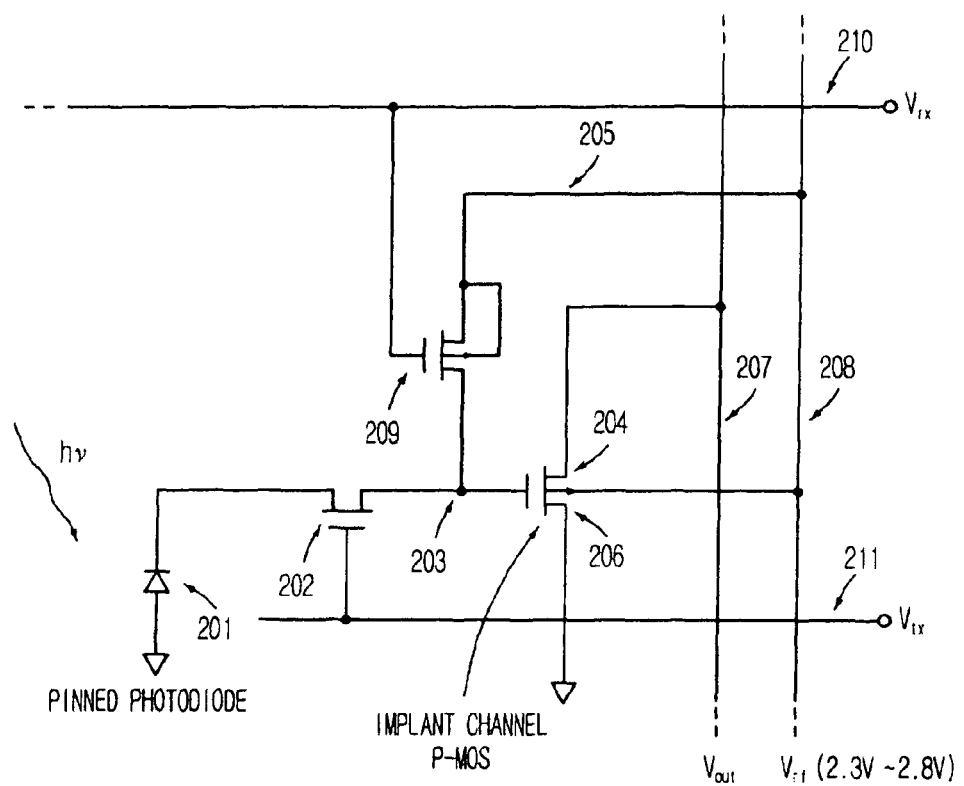
FIG. 2 is a schematic circuit diagram of a 3T CMOS image sensor pixel with the pinned photodiode for sensing light and without an addressing transistor in accordance with a preferred embodiment of the present invention.

FIG. 2 is a schematic circuit diagram of a CMOS image sensor pixel in accordance with a preferred embodiment of the present invention. Referring to FIG. 2, a pinned photodiode 201 is coupled through a charge transfer transistor 202 to a charge detection node, i.e., floating diffusion (FD) node 203. The FD node 203 is reset by a p-channel MOS transistor 209 to a reference voltage (Vrf) node 205. The body of the reset transistor 209 is also connected to the Vrf node 205.

The voltage on the FD node is sensed by a p-channel MOS transistor 204 that has its source connected to the output column bus line 207 and its drain connected to a substrate. Body of the transistor 204 is connected to a reference voltage (Vrf) line 208 that is also one of the column bus lines. The threshold of the transistor 204 is modified by a suitable implant 206 in the channel area so as to make the transistor 204 a depletion type.

Both, the p-channel type and the depletion mode of operation make the transistor 204 more suitable for low noise operation than other types. It is well known in the art that such transistors are superior in noise performance to standard n-channel transistors particularly when a small size is required.

In order to operate this pixel the gate of the charge transfer transistor 202 is connected to a transfer control signal (Vtx) line 211 and the gate of the reset transistor 209 is connected to a reset control signal (Vrx) line 210. Both lines are row bus lines. There is no address transistor in this pixel. That is, as distinguished from the prior art, pixel output signal provided by the p-channel MOS transistor 204 that is a source follower (SF) transistor is transferred to the output column bus line 207 without addressing transistor.

Figure 3:
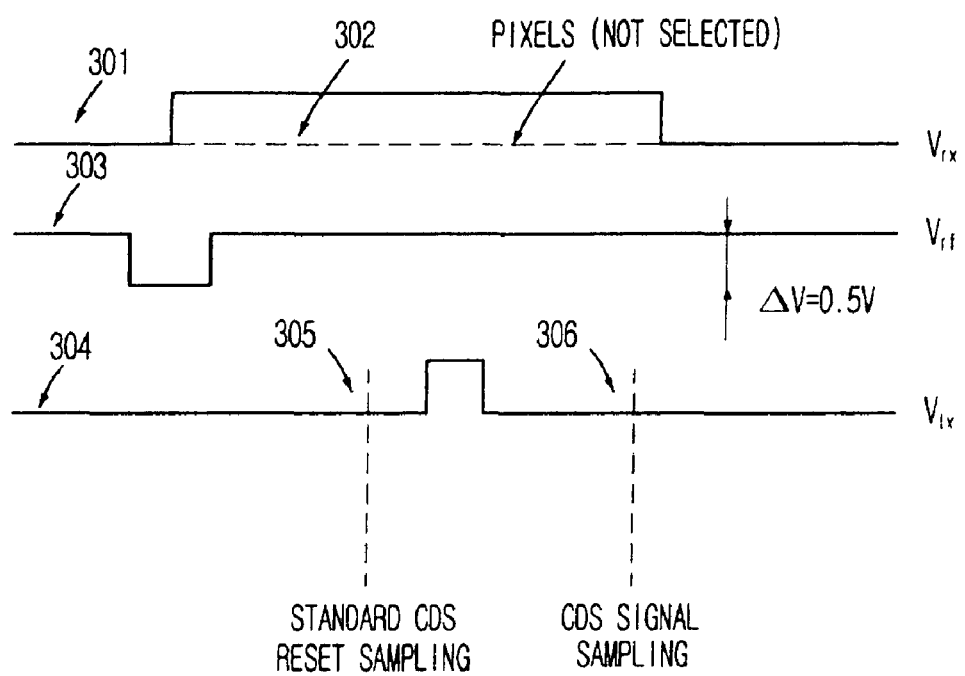
FIG. 3 is a signal timing diagram of the 3T CMOS image sensor pixel described in FIG. 2.

In order to better understand the pixel operation, one embodiment of the simplified pixel timing diagram is shown in FIG. 3. FIG. 3 illustrates timings of the transfer control signal Vtx, the reset control signals Vrx, and the reference voltage Vrf.

Referring to FIG. 3, the solid line 301 represents the pulse waveform supplied to the reset control signal (Vrx) line 210 of the selected pixel. When the reset control signal Vrx transitions to a high logic level the reset transistor 209 is turned off. The pixels that are not selected continue to have their reset control signal (Vrx) line biased low as shown in the drawing by the dotted line 302.

During the transition of the reset control signal Vrx to its high level the reference voltage Vrf is momentarily lowered by a small amount, for example by 0.5V, as indicated by the line 303. The reference voltage (Vrf) pulsing results in FD node bias of the selected pixel to be about 0.5V lower than the reset level of the FD node of all other pixels connected in the same column. This in turn results in only one selected pixel SF transistor 204 being turned on. Such operation is possible by using the p-channel MOS transistor for charge sensing without any need for an addressing transistor. Elimination of the addressing transistor from the pixel improves the pixel output resistance and thus the driving capability, reduces the pixel temporal noise, reduces the pixel transistor count, and finally reduces the pixel row control line number.

The rest of the pixel operation is standard. The pixel output reset level is sampled at the time 305. This is followed by the transition of the transfer control signal Vtx, and finally by sampling the pixel output at the time 306, as described by the line 304. The column processing circuits provide the appropriate pixel bias current as well as the CDS signal subtraction and the remaining signal processing functions.

Figure 4:
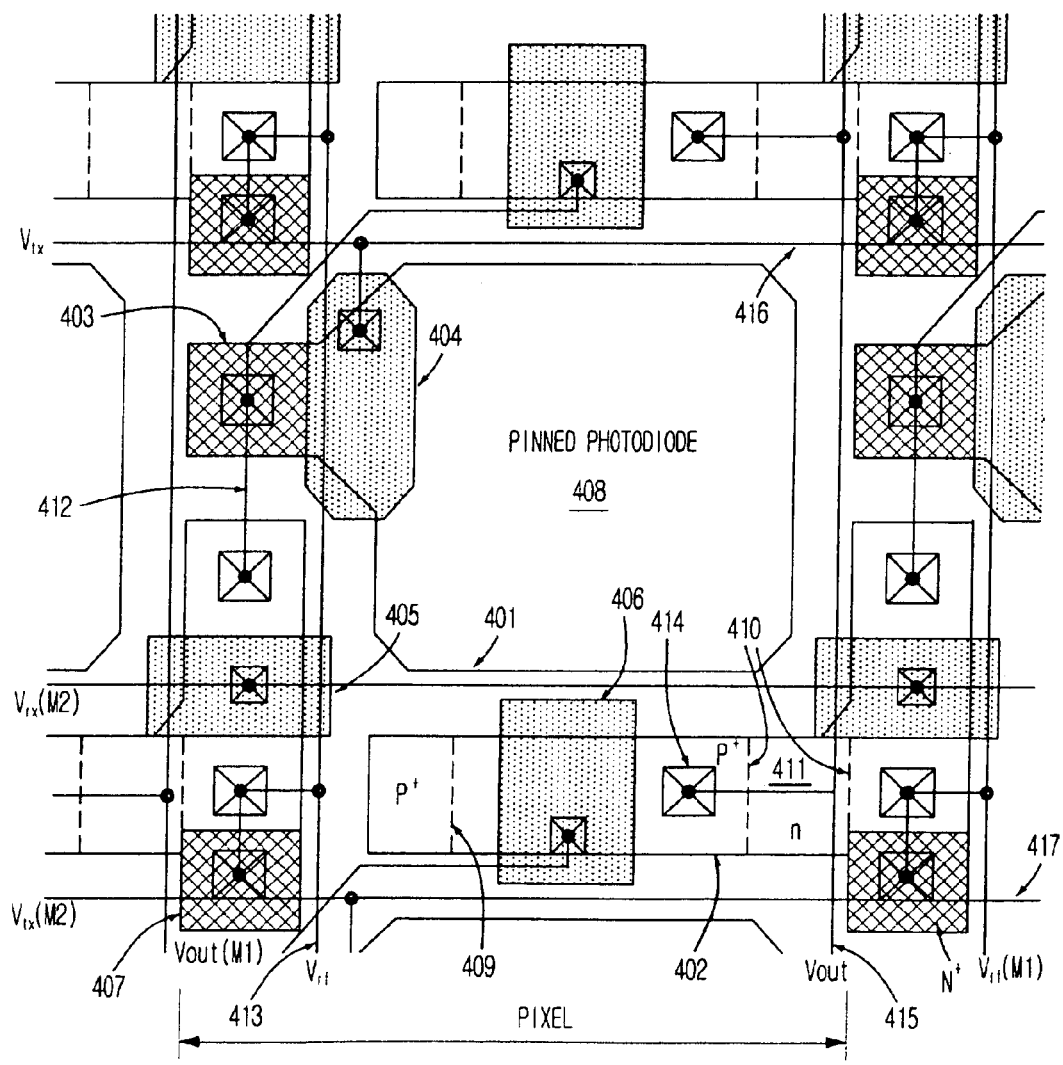
FIG. 4 is a simplified drawing illustrating a layout implementation of the 3T transistor CMOS sensor pixel described in FIG. 2.

For more clarity one possible embodiment of the pixel layout is shown in FIG. 4. The drawing is not to scale and does not show all the physical features of the structure such as, for example, the metal interconnect layers that are indicated only schematically by lines.

An active region 401 contains a pinned photodiode 408, a transfer gate 404, and n+ floating diffusion (FD) 403. A reset transistor gate 405 and a signal sensing transistor gate 406 constitute another separate active region 402. This region has n-well implanted underneath, which is not shown in the drawing. The contact to the n-well is provided by an n+ region 407. The n-well region is bounded by a line 409 in order to provide the sensing transistor p+ drain connection to substrate. Two more dotted lines 410 designate p+ source-drain boundaries for the sensing transistor and for the reset transistor respectively that are isolated from each other by an n-region 411. A local interconnect (LIC) 412 connects the drain of the reset transistor with FD and with the gate of the sensing transistor 406. The source of the reset transistor is connected together with the n-well n+ region 407 to a common column bus line 413, which is formed using the first metal level. The source of the sensing transistor 414 is connected to an output column bus line 415, which is also formed by the first metal level. A row bus line 416 supplies the signal to all transfer transistor gates 404 connected in the same row and similarly a row bus line 417 supplies the signal to all reset transistor gates 405 connected in the same row. Both row bus lines are formed using the second metal level.

Using the LIC it is thus possible to have only two metal layers in the pixel, which reduces the pixel superstructure height and thus improves the pixel optical properties. Other layout modifications and alterations are possible, which is well know to all those skilled in the art. The major differentiating feature of this pixel from the standard counterparts is the presence of the n-well region and the two p-channel MOS transistors in the pixel, one for the charge sensing and the other for the FD reset.

Figure 5:
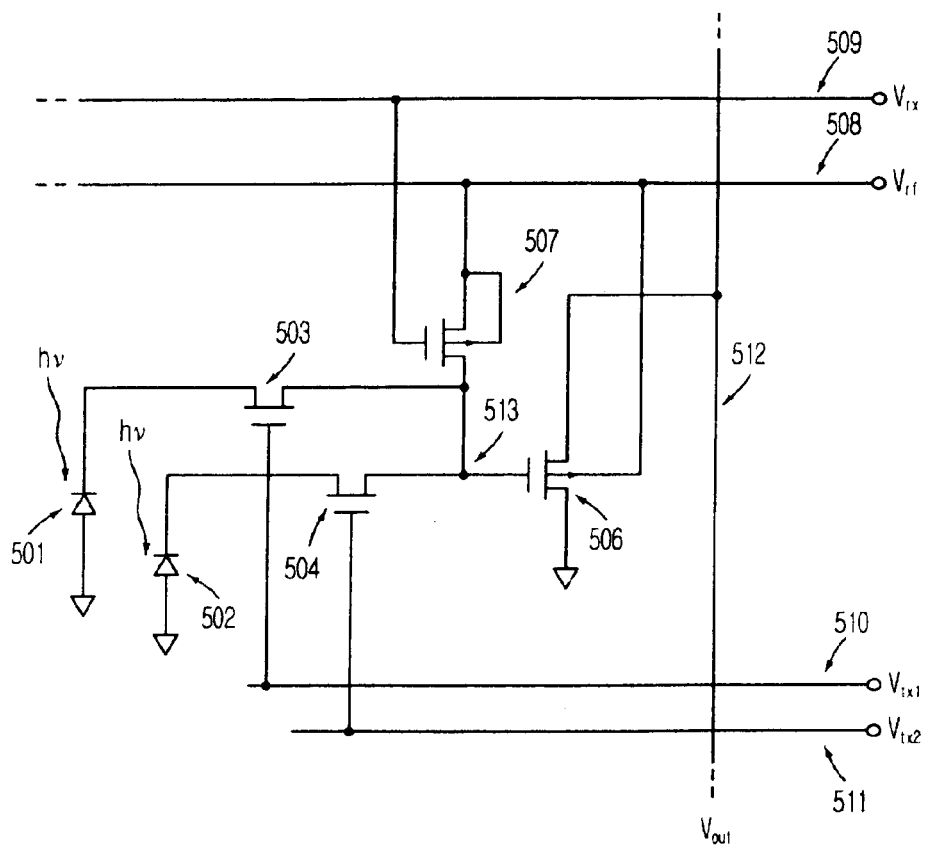
FIG. 5 is a schematic circuit diagram of a CMOS image sensor pixel in accordance with another embodiment of the present invention.

It is, of course, possible to also arrange this pixel into a circuit sharing configuration as is showing in FIG. 5. Referring to FIG. 5, two pixel photodiodes share the same circuitry. This configuration allows maintaining two row bus lines per photo-site but it reduces the number of column bus lines to only a single one for the outputs. This may have an advantage when very small pixels are designed or when the LIC interconnect technology is not available.

In this shared configuration the two pinned photodiodes 501 and 502 are connected through respective charge transfer transistors 503 and 504 to a common FD node 513. The FD node 513 is reset by a reset transistor 507 to a row bus line 508. A sensing transistor 506 is connected to substrate and to a single output column bus line 512. A reference bias voltage and an n-well are provided by the row bus line 508. The row bus lines 510 and 511 supply transfer control signal to respective gates of charge transfer transistors 503 and 504. As a result there are only two row bus lines per photodiode and one column bus line which may lead to smaller and more efficient pixel layouts.

Having thus described preferred embodiments of novel CMOS image sensor pixel which has p-channel MOS reset transistor and p-channel MOS sensing transistor with two row lines and one or two column lines per pixel, which is intended to be illustrative and not limiting, it is noted that persons skilled in the art can make modifications and variations in light of the above teachings.

It is therefore to be understood that changes may be made in the particular embodiments of the invention disclosed, which are within the scope and spirit of the invention as defined by appended claims. That is, while the present invention has been described with respect to the specific embodiments, it will be apparent to those skilled in the art that various changes and modifications may be made without departing from the spirit and scope of the invention as defined in the following claims.

What is claimed is:

1. An image sensor pixel, comprising:
   a photodiode;
   a transfer transistor configured to transfer charge integrated in the photodiode in response to a transfer control signal;
   a floating diffusion node configured to receive charge through the transfer transistor;
   a first p-type transistor configured to reset the floating diffusion node in response to a reset control signal, wherein the first p-type transistor includes a source configured to receive a reference bias; and
   a second p-type transistor configured to generate a pixel output signal corresponding to charge of the floating diffusion node, wherein the second p-type transistor includes a body configured to receive the reference bias.

2. The image sensor pixel of claim 1, wherein the second p-type transistor is further configured to provide the pixel output signal to a pixel output signal line without use of an addressing transistor.

3. The image sensor pixel of claim 2, wherein:
   the first p-type transistor further comprises a drain connected to the floating diffusion node and a gate configured to receive the reset control signal; and
   the second p-type transistor further comprises a gate connected to the floating diffusion node, a drain connected to a ground voltage terminal, and a source configured to output the pixel output signal.

4. The image sensor pixel of claim 3, wherein the second p-type transistor is further configured to output the pixel output signal in response to:
   the reference bias being lowered by a predetermined amount as a pulse type signal;

the reset control signal being active; and
the transfer control signal being inactive.

5. The image sensor pixel of claim 1, wherein the transfer transistor comprises a transfer gate configured to form a channel between the photodiode and the floating diffusion node.

6. The image sensor pixel of claim 1, wherein the second p-type transistor is further configured to operate in depletion mode.

7. An image sensor pixel, comprising:
a plurality of photodiodes;
a plurality of transfer transistors configured to transfer charge integrated in the plurality of photodiodes in response to transfer control signals;
a common floating diffusion node configured to receive charge through the plurality of transfer transistors;
a first p-type transistor configured to reset the common floating diffusion node in response to a reset control signal, wherein the first p-type transistor includes a source configured to receive a reference bias; and
a second p-type transistor configured to generate a pixel output signal corresponding to charge of the common floating diffusion node, wherein the second p-type transistor includes a body configured to receive the reference bias.

8. The image sensor pixel of claim 7, wherein the second p-type transistor is further configured to provide the pixel output signal to a pixel output signal line without use of an addressing transistor.

9. The image sensor pixel of claim 8, wherein:
the first p-type transistor further comprises a drain connected to the common floating diffusion node and a gate configured to receive the reset control signal; and
the second p-type transistor further comprises a gate connected to the common floating diffusion node, a drain connected to a ground voltage terminal, and a source configured to output the pixel output signal.

10. The image sensor pixel of claim 9, wherein the second p-type transistor is further configured to output the pixel output signal in response to:
the reference bias being lowered by a predetermined amount as a pulse type signal;
the reset control signal being active; and
the corresponding transfer control signal being inactive.

11. The image sensor pixel of claim 7, wherein each transfer transistor comprises a transfer gate configured to form a channel between a corresponding photodiode and the common floating diffusion node.

12. The image sensor pixel of claim 7, wherein the second p-type transistor is further configured to operated in depletion mode.

13. An image sensor pixel array, comprising:
pixels arranged in columns and rows, wherein each pixel includes:
a photodiode;
a transfer transistor configured to transfer charge integrated in the photodiode in response to a transfer control signal;
a floating diffusion node configured to receive charge through the transfer transistor;
a first p-type transistor configured to reset the floating diffusion node in response to a reset control signal, wherein the first p-type transistor includes a source to receive a reference bias; and
a second p-type transistor configured to generate a pixel output signal corresponding to charge of the floating diffusion node and to provide the pixel output signal to a pixel output signal line without use of an addressing transistor, wherein the second p-type transistor includes a body configured to receive the reference bias;
a plurality of first column bus lines, each first column bus line configured to carry the pixel output signal of its respective column;
a plurality of second column bus lines, each second column bus line configured to provide the reference bias to its respective column;
a plurality of first row bus lines, each first row bus line configured to provide a reset control signal to its respective row; and
a plurality of second row bus lines, each second row bus line configured to provide a transfer control signal to its respective row.

14. The image sensor pixel array of claim 13, wherein, for each pixel:
the first p-type transistor further comprises a drain connected to the floating diffusion node and a gate configured to receive the reset control signal; and
the second p-type transistor further comprises a gate connected to the floating diffusion node, a drain connected to a ground voltage, and a source configured to output the pixel output signal.

15. The image sensor pixel array of claim 13, wherein, for each pixel, the second p-type transistor is further configured to output the pixel output signal in response to:
the reference bias being lowered by a predetermined amount as a pulse type; and
the reset control signal resetting the floating diffusion node of the corresponding pixel to a lower voltage level than other pixels in the respective column.

16. An image sensor pixel array, comprising:
pixels arranged in columns and rows, wherein each pixel includes:
a plurality of photodiodes;
a plurality of transfer transistors configured to transfer charge integrated in the plurality of photodiodes in response to transfer control signals;
a common floating diffusion node configured to receive charge through the plurality of transfer transistors;
a first p-type transistor configured to reset the common floating diffusion node in response to a reset control signal, wherein the first p-type transistor includes a source configured to receive a reference bias; and
a second p-type transistor configured to generate a pixel output signal corresponding to charge of the common floating diffusion node and to provide the pixel output signal to a pixel output signal line without use of an addressing transistor, wherein the second p-type transistor includes a body configured to receive the reference bias;
a plurality of first column bus lines, each first column bus line configured to carry the pixel output signal of its respective column;
a plurality of first row bus lines, each first row bus line configured to provide the reference bias to its respective row;

a plurality of second row bus lines, each second row bus line configured to provide a reset control signal to its respective row; and a plurality of third row bus lines, each third row bus line configured to provide a transfer control signal to its respective row.

17. The image sensor pixel array of claim 16, wherein, for each pixel:

the first p-type transistor further comprises a drain connected to the common floating diffusion and a gate configured to receive the reset control signal; and the second p-type transistor further comprises a gate connected to the common floating diffusion node, a drain connected to a ground voltage terminal; and a source configured to output the pixel output signal.

18. The image sensor pixel array of claim 16, wherein, for each pixel, the second p-type transistor is further configured to output the pixel output signal in response to:

the reference bias being lowered by a predetermined amount as a pulse type signal; and the reset control signal resetting the common floating diffusion node of the corresponding pixel to a lower voltage level than other pixels in the respective column.

* * * * *

UNITED STATES PATENT AND TRADEMARK OFFICE
CERTIFICATE OF CORRECTION

| | | |
|---|---|---|
| PATENT NO. | : 7,940,319 B2 | Page 1 of 1 |
| APPLICATION NO. | : 12/003166 | |
| DATED | : May 10, 2011 | |
| INVENTOR(S) | : Hynecek | |

It is certified that error appears in the above-identified patent and that said Letters Patent is hereby corrected as shown below:

Column 7, line 52, in Claim 12, delete "operated" and insert -- operate --.

Signed and Sealed this
Eighteenth Day of October, 2011

David J. Kappos
*Director of the United States Patent and Trademark Office*